(12) United States Patent
Liu et al.

(10) Patent No.: US 7,572,533 B2
(45) Date of Patent: Aug. 11, 2009

(54) FLAT PANEL DIRECT METHANOL FUEL CELL AND METHOD OF MAKING THE SAME

(75) Inventors: Yung-Yi Liu, Taipei Hsien (TW); Shi-Shyan James Shang, Taoyuan (TW); Hsi-Ming Shu, Taipei Hsien (TW); Tsang-Ming Chang, Taipei (TW); Feng-Yi Deng, Taipei (TW)

(73) Assignees: Nan Ya Printed Circuit Board Corporation, Luchu, Taoyuan (TW); Antig Technology Co., Ltd., Taipei (TW)

( * ) Notice: Subject to any disclaimer, the term of this patent is extended or adjusted under 35 U.S.C. 154(b) by 295 days.

(21) Appl. No.: 11/735,483

(22) Filed: Apr. 15, 2007

(65) Prior Publication Data

US 2007/0184968 A1  Aug. 9, 2007

Related U.S. Application Data

(62) Division of application No. 10/709,921, filed on Jun. 6, 2004, now Pat. No. 7,220,507.

(30) Foreign Application Priority Data

Mar. 26, 2004  (TW) .............................. 93108441 A

(51) Int. Cl.
*H01M 8/02* (2006.01)
*H01M 8/10* (2006.01)
(52) U.S. Cl. .......................................... 429/32; 429/36
(58) Field of Classification Search ...................... None
See application file for complete search history.

(56) References Cited

U.S. PATENT DOCUMENTS

2003/0091878 A1* 5/2003 Rosenfeld et al. ............. 429/19

* cited by examiner

*Primary Examiner*—Patrick Ryan
*Assistant Examiner*—Alix Echelmeyer
(74) *Attorney, Agent, or Firm*—Winston Hsu

(57) ABSTRACT

A flat panel direct methanol fuel cell (DMFC) includes an integrated cathode electrode sheet; a membrane electrode assembly (MEA) unit; an intermediate bonding layer; an integrated anode electrode sheet; and a fuel container. The fabrication of the integrated cathode/anode electrode sheets is compatible with printed circuit board (PCB) processes.

6 Claims, 12 Drawing Sheets

FLAT PANEL DIRECT METHANOL FUEL CELL AND METHOD OF MAKING THE SAME

CROSS REFERENCE TO RELATED APPLICATIONS

This application is a division of U.S. application Ser. No. 10/709,921 filed Jun. 6, 2004.

BACKGROUND OF THE INVENTION

1. Field of the Invention

The present invention relates generally to the field of fuel cells. More particularly, the present invention relates to a flat panel Direct Methanol Fuel Cell (DMFC) and method of making the same.

2. Description of the Prior Art

A fuel cell is an electrochemical cell in which a free energy change resulting from a fuel oxidation reaction is converted into electrical energy. Fuel cells utilizing methanol as fuel are typically named as Direct Methanol Fuel cells (DMFCs), which generate electricity by combining gaseous or aqueous methanol with air. DMFC technology has become widely accepted as a viable fuel cell technology that offers itself to many application fields such as electronic apparatuses, vehicles, military equipments, aerospace industry and so on.

DMFCs, like ordinary batteries, provide dc electricity from two electrochemical reactions. These reactions occur at electrodes (or poles) to which reactants are continuously fed. The negative electrode (anode) is maintained by supplying methanol, whereas the positive electrode (cathode) is maintained by the supply of air. When providing current, methanol is electrochemically oxidized at the anode electrocatalyst to produce electrons, which travel through the external circuit to the cathode electrocatalyst where they are consumed together with oxygen in a reduction reaction. The circuit is maintained within the cell by the conduction of protons in the electrolyte. One molecule of methanol ($CH_3OH$) and one molecule of water ($H_2O$) together store six atoms of hydrogen. When fed as a mixture into a DMFC, they react to generate one molecule of $CO_2$, 6 protons ($H^+$), and 6 electrons to generate a flow of electric current. The protons and electrons generated by methanol and water react with oxygen to generate water. The methanol-water mixture provides an easy means of storing and transporting hydrogen, much better than storing liquid or gaseous hydrogen in storage tanks. Unlike hydrogen, methanol and water are liquids at room temperature and are easily stored in thin walled plastic containers. Therefore, DMFCs are lighter than their nearest rival hydrogen-air fuel cells.

In terms of the amount of electricity generated, a DMFC can currently generate 300-500 milliwatts per centimeter squared. The area of the cell size and the number of cells stacked together will provide the necessary power generation for whatever the watt and kilowatt needs are for vehicular and stationary applications.

FIG. 1 and FIG. 2 illustrates a conventional DMFC 10, wherein FIG. 1 is a plan view of the conventional DMFC 10 and FIG. 2 is a cross-sectional view of the conventional DMFC 10 along line I-I of FIG. 1. As shown in FIG. 1 and FIG. 2, the conventional DMFC 10 comprises a bipolar platelet assembly 12 and a fuel container 14. The bipolar platelet assembly 12 comprises an upper frame 51, lower frame 52, cathode wire lath 121, a plurality of bended bipolar wire laths 122, 123, 124, 125, an anode wire lath 126, and membrane electrode assembly (MEA) 131, 132, 133, 134, 135 interposed between corresponding wire laths. The upper frame 51, the lower frame 52, the cathode wire lath 121, the plural bended bipolar wire laths 122, 123, 124, 125, the anode wire lath 126, and the MEA 131, 132, 133, 134, 135 are adhesively stacked together to produce the stack structure as shown in FIG. 2. Typically, epoxy resin 53 or the like is used in between adjacent MEA, thereby forming five basic cell units 21, 22, 23, 24 and 25. As known in the art, the cathode wire lath 121, bended bipolar wire laths 122, 123, 124, 125, and the anode wire lath 126 are titanium meshes treated by gold plating, and are therefore costly.

The basic cell unit 21 of the prior art DMFC 10 consists of the cathode wire lath 121, MEA 131, and the bended bipolar wire lath 122. The basic cell unit 22 consists of the bended bipolar wire lath 122, which functions as a cathode of the cell unit 22, MEA 132, and the bended bipolar wire lath 123, which functions as an anode of the cell unit 22. The basic cell unit 23 consists of the bended bipolar wire lath 123, which functions as a cathode of the cell unit 23, MEA 133, and the bended bipolar wire lath 124, which functions as an anode of the cell unit 23. The basic cell unit 24 consists of the bended bipolar wire lath 124, which functions as a cathode of the cell unit 24, MEA 134, and the bended bipolar wire lath 125, which functions as an anode of the cell unit 24. The basic cell unit 25 consists of the bended bipolar wire lath 125, which functions as a cathode of the cell unit 25, MEA 135, and the bended bipolar wire lath 126, which functions as an anode of the cell unit 25. Typically, each of the basic cell units 21, 22, 23, 24 and 25 provides a voltage of 0.6V, such that DMFC 10 comprising five serially connected basic cell units 21, 22, 23, 24 and 25 can provide a total voltage of 3.0V (0.6V×5=3.0V).

However, the above-described conventional DMFC 10 has several drawbacks. First, the bipolar platelet assembly 12 is too thick and thus unwieldy to carry. Furthermore, as mentioned, the cost of producing the conventional DMFC 10 is high since the cathode wire lath 121, bended bipolar wire laths 122, 123, 124, 125, and the anode wire lath 126 are titanium meshes treated by gold plating. Besides, the throughput of the conventional DMFC 10 is low because the bipolar wire laths 122, 123, 124, 125 are bended manually before mounting on the upper and lower frames. In light of the above, there is a need to provide a thin, inexpensive, and highly integrated DMFC that is capable of achieving the scale of mass production.

SUMMARY OF THE INVENTION

It is therefore the primary object of the present invention to provide an improved thin flat panel type DMFC to solve the above-mentioned problems.

It is another object of the present invention to provide a method for fabricating a thin and highly integrated DMFC, thereby achieving the scale of mass production and thus saving cost, wherein the method for fabricating the highly integrated DMFC is compatible with standard PCB (printed circuit board) processes.

According to the claimed invention, a flat-panel direct methanol fuel cell (DMFC) is provided. The present invention DMFC comprises an integrated cathode electrode sheet, a membrane electrode assembly (MEA) unit, an intermediate bonding layer, an integrated anode electrode sheet, and a fuel container. The integrated cathode electrode sheet comprises a first substrate, a plurality of cathode electrode areas, a plurality of first conductive via through holes, wherein the cathode electrode areas is electroplated on a front side and backside of the first substrate and has a plurality of apertures therein, wherein the first conductive via through holes are disposed outside the cathode electrode areas and is electrically connected to respective cathode electrode areas with a conductive wire. The membrane electrode assembly (MEA) unit comprises a plurality of proton exchange membranes corresponding to the plurality of cathode electrode areas. The intermediate bonding layer comprises at least one bonding sheet, wherein the intermediate bonding layer comprises a plurality of openings for respectively accommodating the plurality of proton exchange membranes, and a plurality of second conductive via through holes that are aligned with the first conductive via through holes. The integrated anode electrode sheet comprises a second substrate, a plurality of anode electrode areas corresponding to the plurality of cathode electrode areas, and a plurality of third conductive via through holes corresponding to the second conductive via through holes.

According to one aspect of the present invention, a method for fabricating an integrated cathode electrode sheet of a flat-panel direct methanol fuel cell is provided. The method comprises the steps of:

(1) providing a CCL (copper clad laminate) substrate comprising a base layer, a first copper layer laminated on an upper surface of the base layer, and a second copper layer laminated on a lower surface of the base layer;

(2) drilling the CCL substrate within pre-selected electrode areas to form a plurality of apertures through the first copper layer, the base layer and the second copper layer;

(3) chemically depositing a third copper layer on the CCL substrate and interior sidewalls of inside the apertures;

(4) forming a patterned resist layer on the CCL substrate to expose the pre-selected electrode areas;

(5) using the patterned resist layer as a plating mask, performing an electroplating process to electroplate a fourth copper layer within the expose the pre-selected electrode areas and area not covered by the patterned resist layer, and then electroplating a Sn/Pb layer on the fourth copper layer;

(6) stripping the patterned resist layer;

(7) performing a copper etching process to etch away the third copper layer and the first and second copper layer that are not covered by the Sn/Pb layer; and (8) removing the Sn/Pb layer to expose the fourth copper layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 4 to FIG. 12 illustrate a method for fabricating integrated thin cathode electrode sheet and integrated thin anode electrode sheet of the DMFC according to this invention; wherein FIG. 4 depicts a CCL (copper clad laminate) substrate;

FIG. 5 shows the CCL substrate with drilled through holes;

FIG. 6 depicts a chemically deposited copper layer covering the surface and exposed interior sidewalls of the CCL substrate;

FIG. 7 shows a patterned resist formed on the CCL substrate;

FIG. 8 shows an electroplated copper layer on the CCL substrate covered with an electroplated tin/lead composite layer;

FIG. 9 represents the step of the removal of the patterned resist;

FIG. 10 represents the etching process to remove the copper layer not covered by the tin/lead composite layer;

FIG. 11 shows a solder resist layer; and

FIG. 12 shows an optional conduction protection layer.

DETAILED DESCRIPTION

Figure 1:
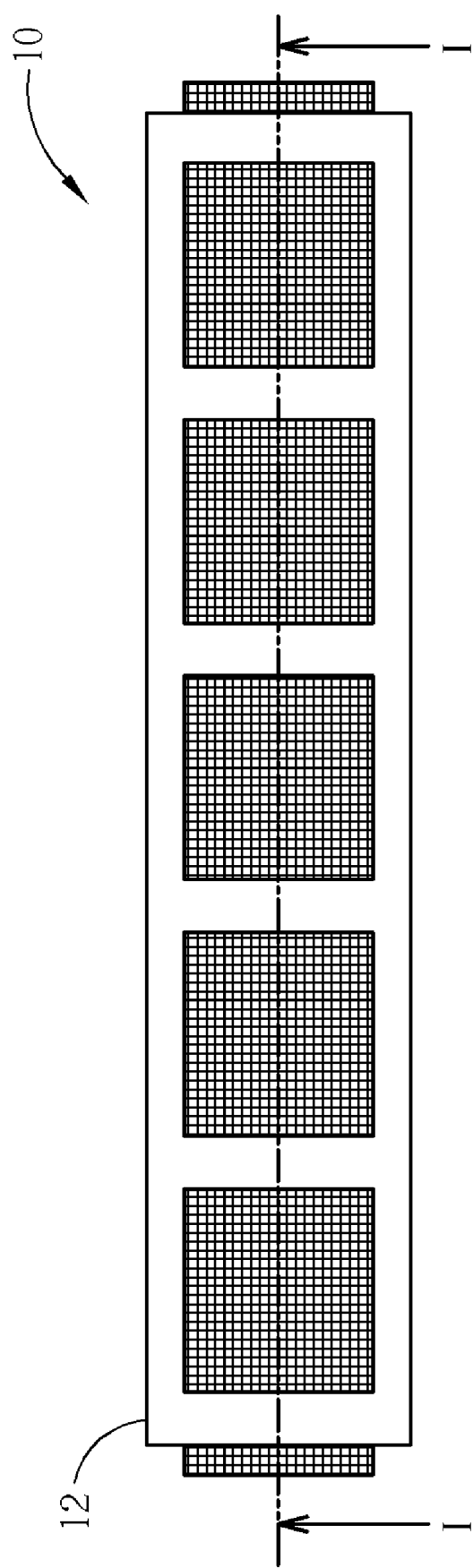
FIG. 1 is a plain view of the conventional Direct Methanol Fuel Cell.
Figure 2:
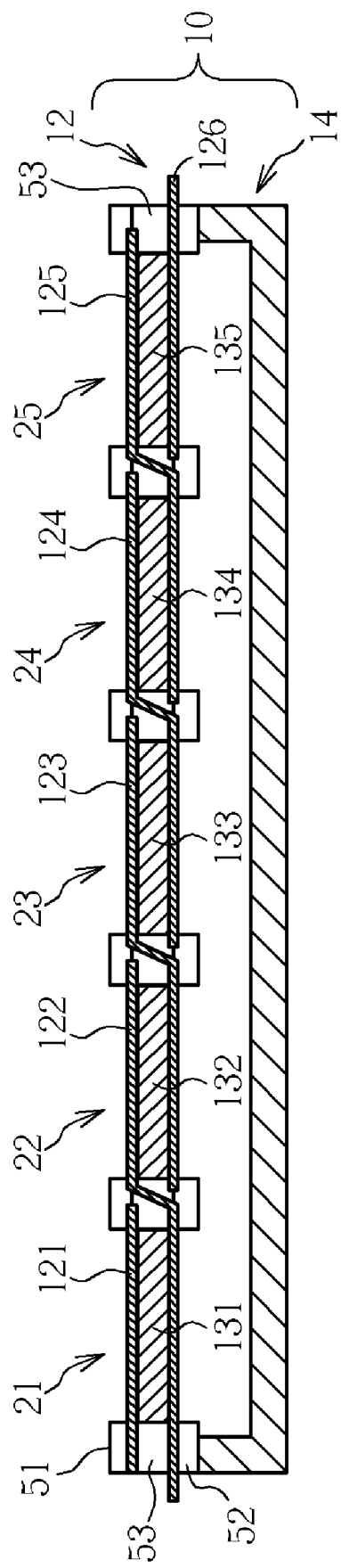
FIG. 2 is a cross-sectional view of the conventional Direct Methanol Fuel Cell along line I-I of FIG. 1.
Figure 3:
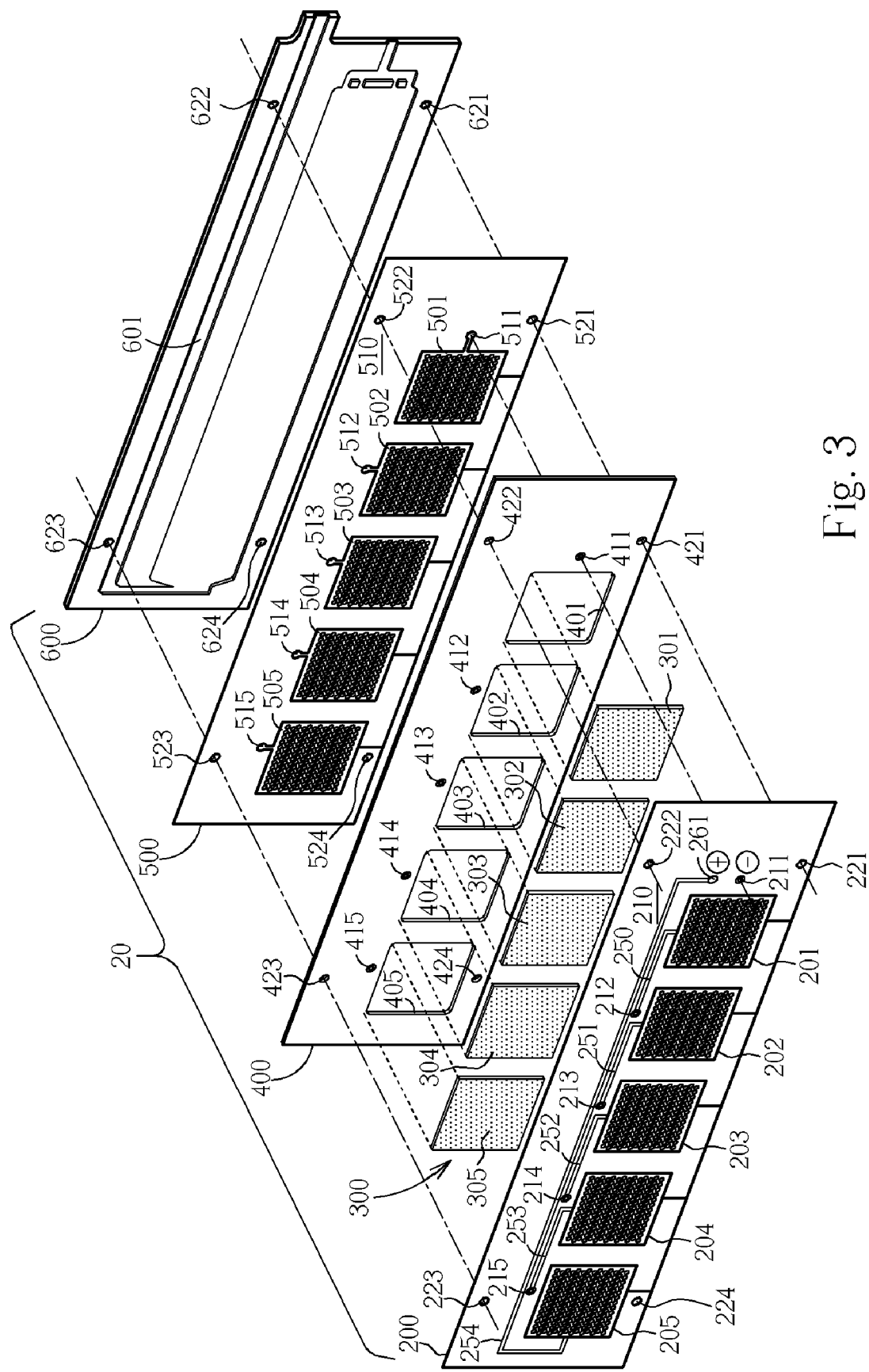
FIG. 3 is a perspective, exploded diagram illustrating a flat panel Direct Methanol Fuel Cell with five serially connected basic cell units in accordance with one preferred embodiment of the present invention.

Please refer to FIG. 3. FIG. 3 is a perspective, exploded diagram illustrating a flat panel DMFC 20 with five serially connected basic cell units in accordance with one preferred embodiment of the present invention. It is to be understood that the flat panel DMFC 20 with five serially connected basic cell units is merely an exemplary embodiment. Depending on the requirements of the applied apparatuses, other numbers of basic cell units such as ten or twenty may be used. As shown in FIG. 3, the present invention flat panel DMFC 20 generally comprises an integrated thin cathode electrode sheet 200, Membrane Electrode Assembly (MEA) unit 300, intermediate bonding layer 400, integrated thin anode electrode sheet 500, and a fuel container 600.

The integrated thin cathode electrode sheet 200 comprises a substrate 210, cathode electrode areas 201, 202, 203, 204, and 205, and conductive via through holes 211, 212, 213, 214, and 215. Preferably, on the surface area of the substrate 210 outside the cathode electrode areas 201, 202, 203, 204, and 205, and the conductive via through hole 211, 212, 213, 214, and 215, a layer of solder resist is coated thereon. At the corners of the substrate 210, mounting through holes 221, 222, 223, and 224 are provided. It is noteworthy that the integrated thin cathode electrode sheet 200 is compatible with PCB processes. The substrate 210 may be made of ANSI-grade glass fiber reinforced polymeric materials such as FR-1, FR-2, FR-3, FR-4, FR-5, CEM-1 or CEM-3, but not limited thereto. Each of the cathode electrode areas 201, 202, 203, 204, and 205, on which a plurality of through holes are formed, is defined by a patterned copper foil. The opening ratio of each of the cathode electrode areas 201, 202, 203, 204, and 205, which is the ratio of the surface area of the through holes to the area of each of the cathode electrode areas, is preferably no less than 50%.

The conductive via through hole 212 is electrically connected to the cathode electrode area 201 with the conductive wire 250. The conductive via through hole 213 is electrically connected to the cathode electrode area 202 with the conductive wire 251. The conductive via through hole 214 is electrically connected to the cathode electrode area 203 with the conductive wire 252. The conductive via through hole 215 is electrically connected to the cathode electrode area 204 with the conductive wire 253. The cathode electrode area 205 is electrically connected to a positive (cathode) electrode node 261, which, in operation, is further electrically connected with an external circuit. The conductive via through hole 211, which acts as a negative (anode) electrode node of the DMFC 20, is electrically connected with the external circuit in operation.

The MEA unit 300 comprises a first proton exchange membrane 301, a second proton exchange membrane 302, a third proton exchange membrane 303, a fourth proton exchange membrane 304, and a fifth proton exchange membrane 305, corresponding to the cathode electrode areas 201, 202, 203, 204, and 205. Each of the proton exchange membranes 301, 302, 303, 304, and 305 may use commercially available proton conducting polymer electrolyte membranes, for example, Nafion™, but not limited thereto.

The intermediate bonding layer 400 comprises at least one bonding sheet, which may be made of Prepreg B-stage resin, which is an ordinary material in PCB processes. The Prepreg B-stage resin may be completely cured at about 140° C. for process time period of about 30 minutes. Corresponding to the proton exchange membranes 301, 302, 303, 304, and 305, five openings 401, 402, 403, 404, and 405 are provided on the intermediate bonding layer 400 for fitly accommodating respective proton exchange membranes. At a side of the opening 401 corresponding to the conductive via through hole 211 of the substrate 210, as specifically indicated in FIG. 3, a conductive via through hole 411 is provided. At a side of respective openings 402, 403, 404, and 405 corresponding to the conductive via through holes 212, 213, 214, and 215, conductive via through holes 412, 413, 414, and 415 are provided. In another case, the intermediate bonding layer 400 may further a thin supporting layer that is made of glass fiber reinforced polymeric materials such as FR-1, FR-2, FR-3, FR-4, FR-5, CEM-1 or CEM-3. At the corners, corresponding to the mounting through holes 221, 222, 223, and 224 of the substrate 210, there are mounting through holes 421, 422, 423, and 424 provided.

The integrated thin anode electrode sheet 500 comprises a substrate 510, anode electrode areas 501, 502, 503, 504, and 505, and conductive-pads 511, 512, 513, 514, and 515. It is noteworthy that the anode electrode areas 501, 502, 503, 504, 505 are defined simultaneously with the conductive-pads 511, 512, 513, 514, 515. At the corners of the substrate 510, corresponding to the mounting through holes 221, 222, 223, and 224 of the substrate 210, there are mounting through holes 521, 522, 523, and 524 provided. The integrated thin anode electrode sheet 500 is compatible with PCB processes. Likewise, the substrate 510 may be made of ANSI-grade glass fiber reinforced polymeric materials such as FR-1, FR-2, FR-3, FR-4, FR-5, CEM-1, CEM-3 or the like. Each of the anode electrode areas 501, 502, 503, 504, and 505, on which a plurality of through holes are formed, is defined by a patterned copper foil. The opening ratio of each of the anode electrode areas is preferably no less than 50%.

The fuel container 600 has fuel channel 601 and mounting through holes 621, 622, 623, and 624 corresponding to the mounting through holes 221, 222, 223, and 224 of the substrate 210. The fuel container 600 may be made of polymeric materials such as epoxy resin, polyimide, or Acrylic. The fuel channel 601 may be fabricated by using conventional mechanical grinding methods or plastic extrusion methods.

When assembling, the proton exchange membranes 301, 302, 303, 304, and 305 are fitly installed within the openings 401, 402, 403, 404, and 405 of the intermediate bonding layer 400. The intermediate bonding layer 400, together with the installed proton exchange membranes 301, 302, 303, 304, and 305, is then sandwiched by the integrated thin cathode electrode sheet 200 and the integrated thin anode electrode sheet 500. The resultant laminate stack consisting in the order of the integrated thin cathode electrode sheet 200, intermediate bonding layer 400 (and installed proton exchange membranes), and the integrated thin anode electrode sheet 500 is then mounted on the fuel container 600.

The conductive via through holes 211, 212, 213, 214 and 215 of the integrated thin cathode electrode sheet 200 are aligned, and in contact, with the respective conductive via through holes 411, 412, 413, 414 and 415 of the intermediate bonding layer 400, which are aligned with the conductive pads 511, 512, 513, 514 and 515 of the integrated thin anode electrode sheet 500. Conventional soldering process may be used to electrically connected and fix the aligned conductive through holes such as conductive via through holes 211, 411, and conductive pad 511, and so on. By doing this, the cathode electrode area 201 of the integrated thin cathode electrode sheet 200 is electrically connected to the anode electrode area 502 of the integrated thin anode electrode sheet 500 through the conductive path constituted by the conductive wire 250, the soldered conductive via through holes 212 and 412, and the conductive pad 512 of the integrated thin anode electrode sheet 500. The cathode electrode area 202 of the integrated thin cathode electrode sheet 200 is electrically connected to the anode electrode area 503 of the integrated thin anode electrode sheet 500 through the conductive path constituted by the conductive wire 251, the soldered conductive via through holes 213 and 413, and the conductive pad 513 of the integrated thin anode electrode sheet 500, and so on. The conductive via through hole 211 of the integrated thin cathode electrode sheet 200, which acts as the negative electrode of the DMFC 20, is electrically connected to the anode electrode area 501 of the integrated thin anode electrode sheet 500 through the conductive via through hole 411 of the intermediate bonding layer 400.

It is advantageous to use the present invention because the DMFC 20 has integrated thin cathode electrode sheet 200 and integrated thin anode electrode sheet 500, which reduce the thickness as well as the production cost of the DMFC 20. No bended bipolar wire lath is needed. The integrated thin cathode electrode sheet 200 and integrated thin anode electrode sheet 500 are compatible with PCB processes, thus can achieve the scale of mass production. Another benefit is that the control circuit layout for controlling the DMFC and external circuit can be integrated on the substrate 210 or 510.

A method for fabricating integrated thin cathode electrode sheet 200 and integrated thin anode electrode sheet 500 of the DMFC 20 is now described in detail with reference to FIG. 4 to FIG. 12. According to this invention, the method for fabricating integrated thin cathode electrode sheet 200 and integrated thin anode electrode sheet 500 of the DMFC 20 is compatible with standard PCB processes.

Figure 4:
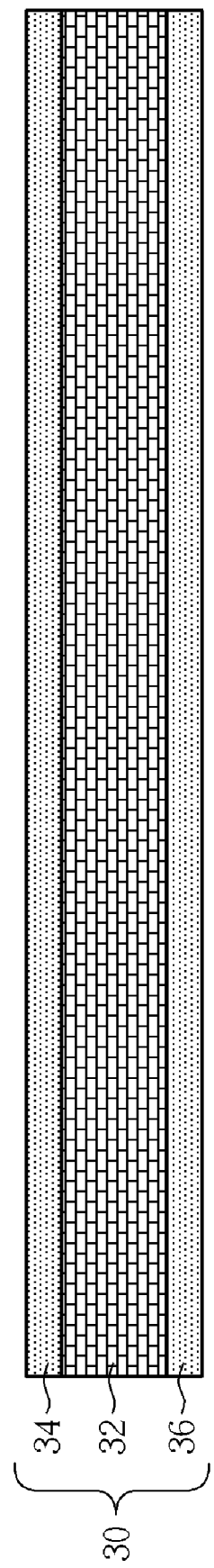

First, as shown in FIG. 4, a CCL (Copper Clad Laminate) substrate 30 is provided. The CCL substrate 30 is commercially available and has a thickness of few millimeters. The CCL substrate 30 comprises a base layer 32, a copper layer 34 laminated on an upper surface of the base layer 32, and a copper layer 36 laminated on a lower surface of the base layer 32.

Figure 5:
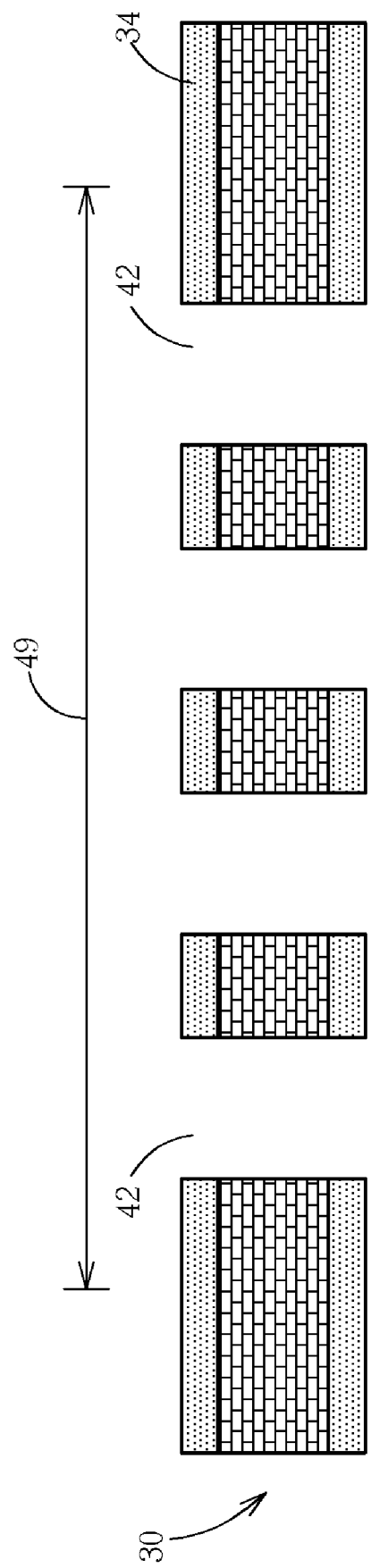

As shown in FIG. 5, a conventional drilling process is carried out to drill a plurality of through holes 42 in the CCL substrate 30 within pre-selected electrode areas 49. In accordance with the preferred embodiment, the surface area of the through holes 42 within a pre-selected electrode area is preferably more than 50% of the surface area of the pre-selected electrode area.

Figure 6:
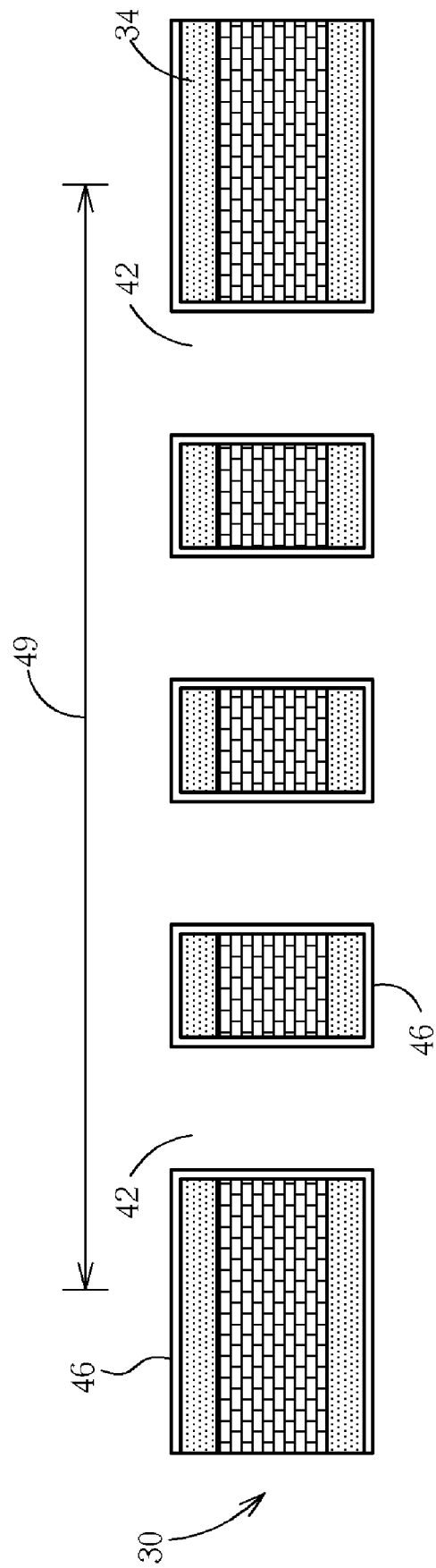

Subsequently, as shown in FIG. 6, a thin copper layer 46 is chemically deposited on the CCL substrate 30 and on the exposed interior sidewalls of the through holes 42. It is noted that the copper layer 46 is deposited in a non-selective manner.

Figure 7:
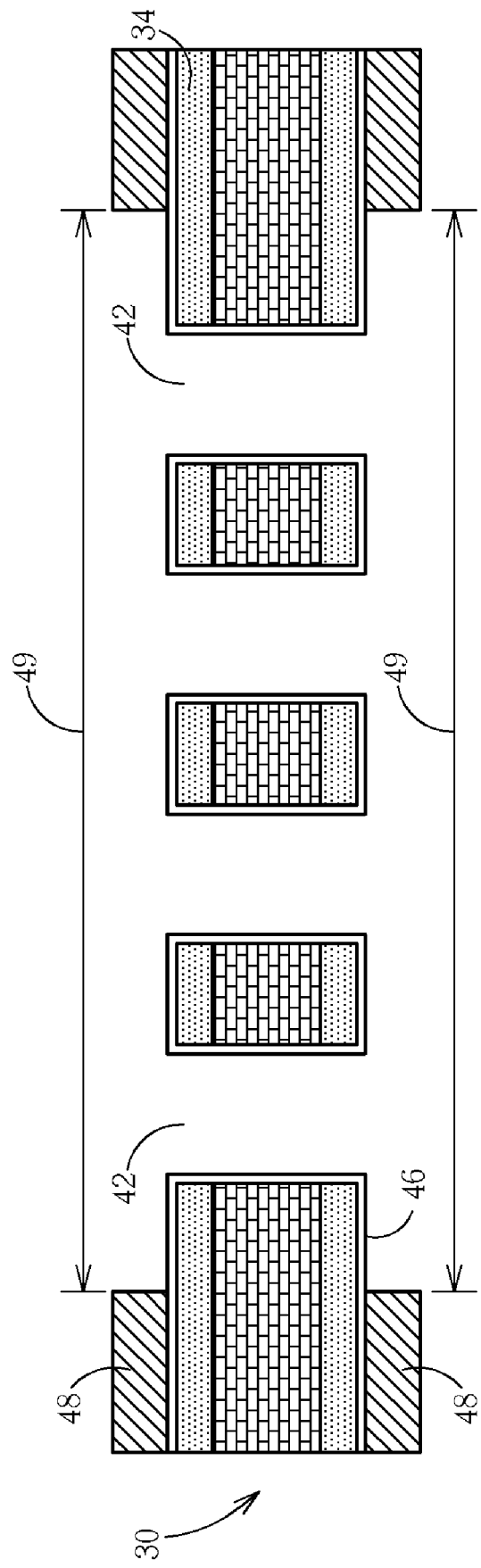

As shown in FIG. 7, a patterned resist (dry film) 48 is formed on the CCL substrate 30 to expose the pre-selected electrode areas 49. Taking the integrated cathode electrode sheet 200 of FIG. 3 as an example, the pre-selected electrode areas 49 defined by the patterned resist 48 is one of the cathode electrode areas 201~205. Not shown in FIG. 7, the patterned resist 48 also defines the conductive wires 250~254 and the positive electrode node 261. It is noted that the conductive via through holes 211~215 of the integrated cathode electrode sheet 200 are formed simultaneously with the through holes 42 in the same drilling process. Taking the integrated anode electrode sheet 500 of FIG. 3 as an example, the pre-selected electrode areas 49 defined by the patterned resist 48 is one of the anode electrode areas 501~505, and the patterned resist 48 also defines the conductive pads 511~515 (not shown in FIG. 7).

Figure 8:
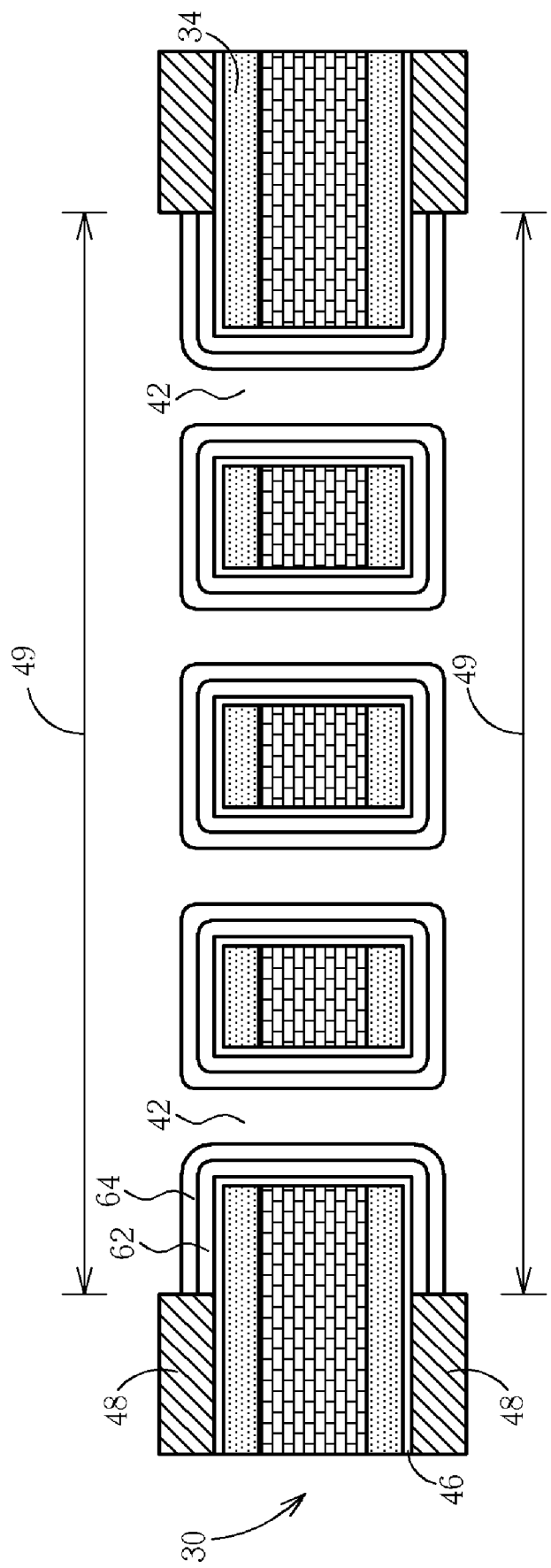

As shown in FIG. 8, using the patterned resist 48 as a plating mask, an electroplating process is carried out to form a copper layer 62 on the CCL substrate 30 where is not covered by the patterned resist 48 including the pre-selected electrode areas 49. A tin/lead (Sn/Pb) composite layer 64 is then electroplated on the copper layer 62.

Figure 9:
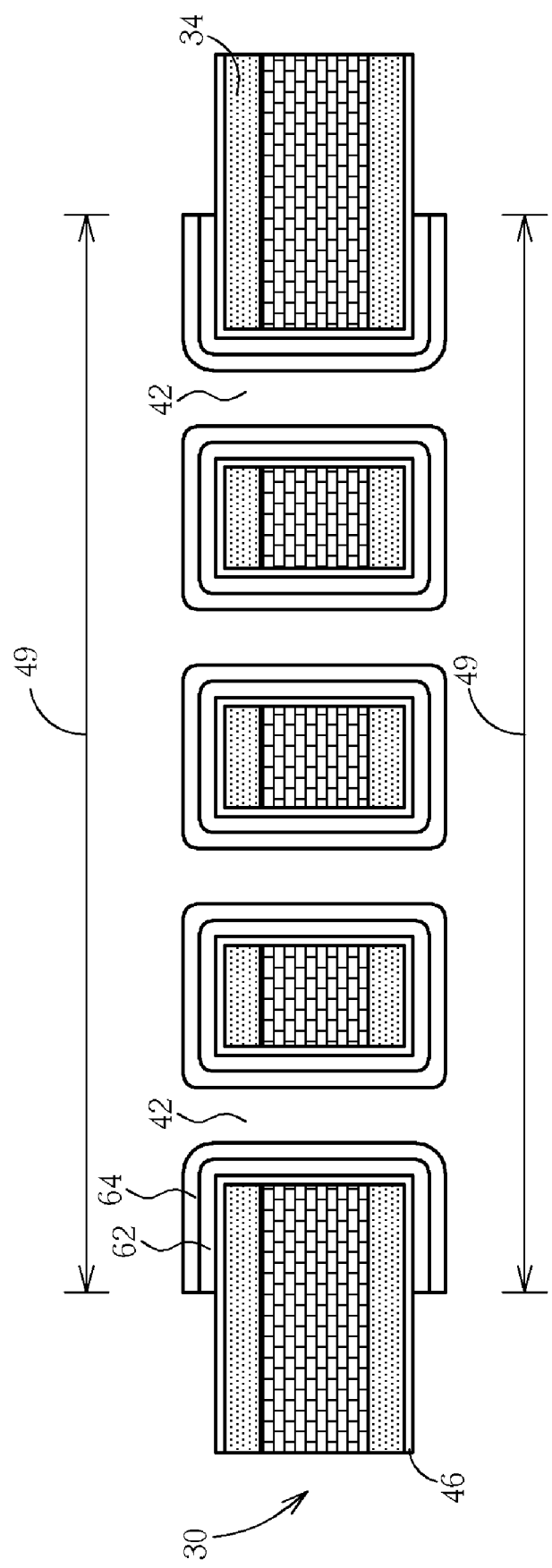

As shown in FIG. 9, the patterned resist 48 is stripped to expose the rest of the copper layer 46.

Figure 10:
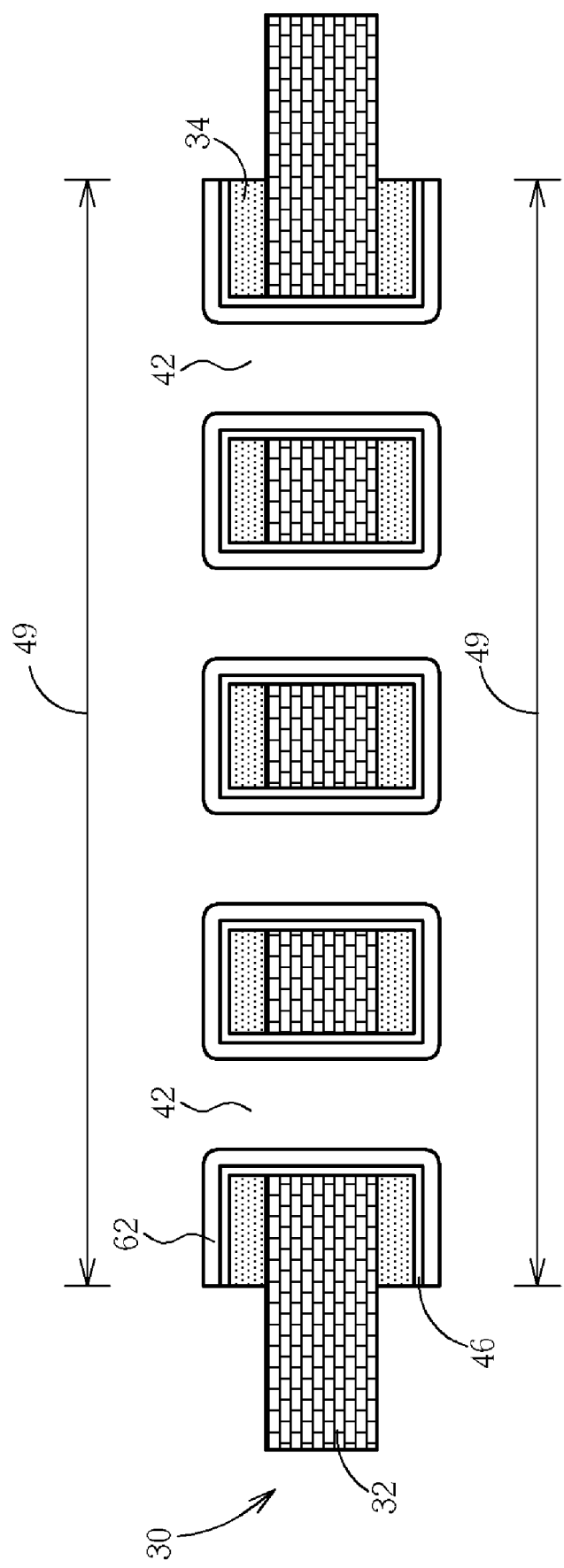

As shown in FIG. 10, a copper etching process such as conventional wet etching is then carried out to etch away the copper layer 46 and the copper layers 34 and 36 that are not covered by the Sn/Pb layer 64. After this, another etching process is carried out to etch away the Sn/Pb layer 64, thereby exposing the remaining copper layer 62. At this stage, the fabrication of the integrated anode electrode sheet 500 of FIG. 3 is complete.

Figure 11:
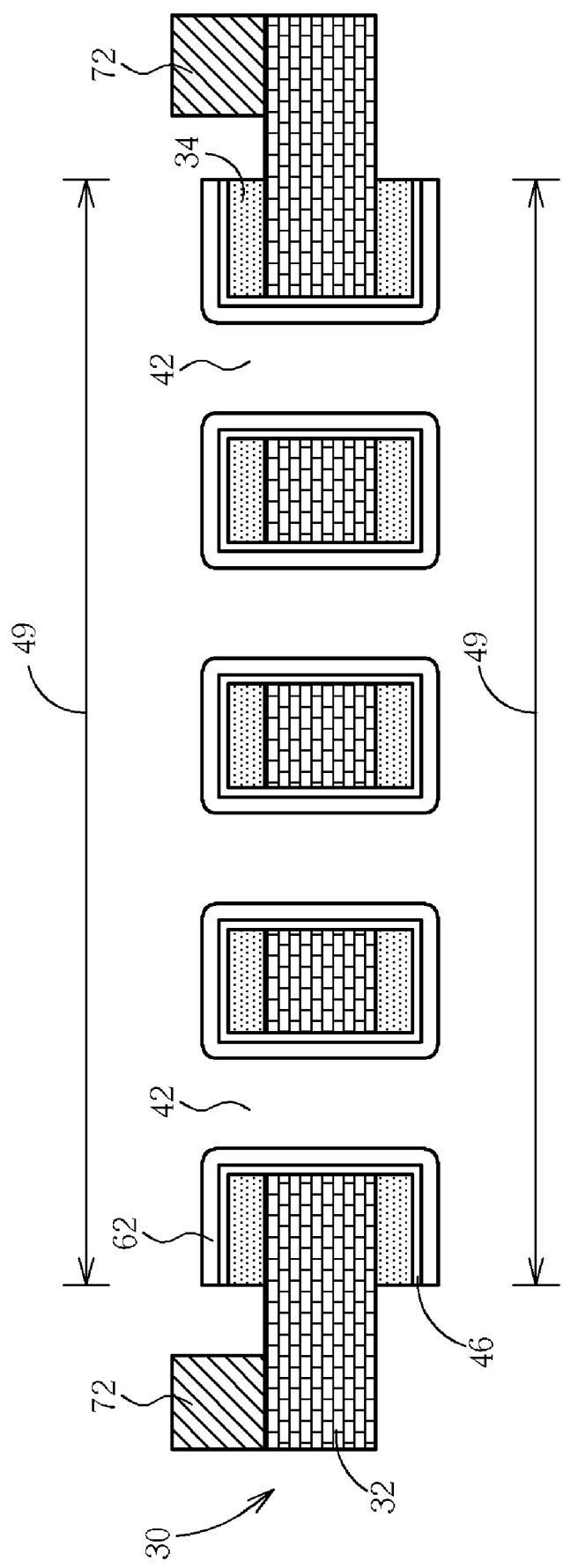

To complete the fabrication of the integrated cathode electrode sheet 200 of FIG. 3, there are still few steps to go. As shown in FIG. 11, to prevent short-circuiting caused during the subsequent soldering process and potential damages to the substrate, a solder resist layer 72 is coated. The solder resist layer 72 may be made of materials that are commercially available and are commonly used in conventional PCB processes. Preferably, the solder resist layer 72 is made of photosensitive materials that can be patterned by using conventional lithographic process to define the protected area on the electrode sheet 200.

Figure 12:
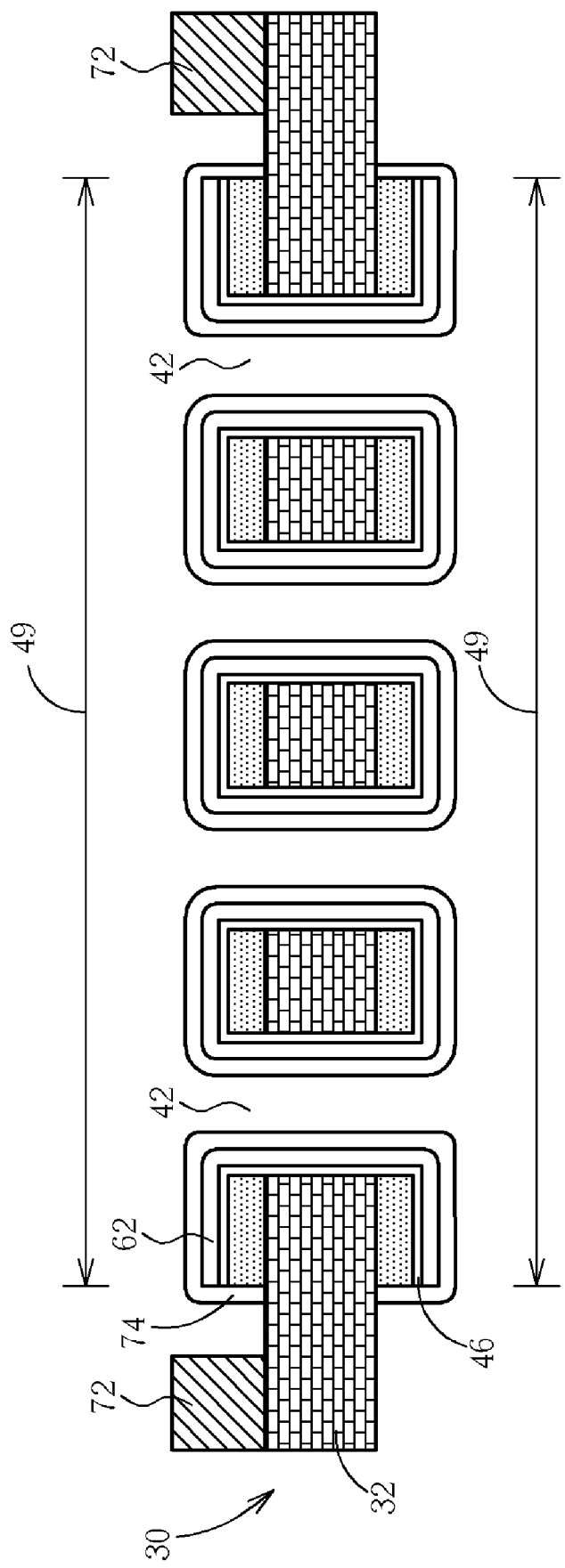

As shown in FIG. 12, optionally, to further protect the integrated cathode electrode sheet 200 from oxidation due to long-term contact with air, a conductive protection layer 74 is coated on the electrode. The conductive protection layer 74 may be made of nickel/gold (Ni/Au), tin/lead (Sn/Pb), or chemical silver.

To sum up, the present invention flat panel type DMFC encompasses at least the following advantages.

The cost per cell is reduced since the starting material, CCL substrate, is cheaper. Besides, the process of fabricating the germane parts, the integrated thin cathode electrode sheet 200 and integrated thin anode electrode sheet 500 of the DMFC 20, is compatible with mature PCB processes.

The process of fabricating the germane parts, the integrated thin cathode electrode sheet 200 and integrated thin anode electrode sheet 500 of the DMFC 20, is compatible with mature PCB process. The production cost is therefore reduced.

No bended bipolar wire lath is needed. The manufacture of the integrated thin cathode electrode sheet 200 and integrated thin anode electrode sheet 500 can therefore achieve the scale of mass production. Direct stack assembly is more precise.

The control circuit layout for controlling the lithium battery of portable apparatus, the DMFC and the external circuit can be simultaneously fabricated on the laminate substrate, thus reducing the size of the DMFC and increasing the integrity of the DMFC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating an integrated cathode electrode sheet of a flat-panel direct methanol fuel cell, the method comprising:
   (1) providing a CCL (copper clad laminate) substrate comprising a base layer, a first copper layer laminated on an upper surface of the base layer, and a second copper layer laminated on a lower surface of the base layer;
   (2) drilling the CCL substrate within pre-selected electrode areas to form a plurality of apertures through the first copper layer, the base layer and the second copper layer;
   (3) chemically depositing a third copper layer on both surfaces of the CCL substrate and interior sidewalls of inside the apertures;
   (4) forming a patterned resist layer on the CCL substrate to expose the pre-selected electrode areas;
   (5) using the patterned resist layer as a plating mask, performing an electroplating process to electroplate a fourth copper layer within the expose the pre-selected electrode areas and area not covered by the patterned resist layer, and then electroplating a Sn/Pb layer on the fourth copper layer;
   (6) stripping the patterned resist layer;
   (7) performing a copper etching process to etch away the third copper layer and the first and second copper layer that are not covered by the Sn/Pb layer; and
   (8) removing the Sn/Pb layer to expose the fourth copper layer.

2. The method according to claim 1 wherein after removing the Sn/Pb layer, the method further comprises the following steps:
   (9) coating a solder resist layer outside the pre-selected electrode areas; and
   (10) electroplating a conductive protection layer on the fourth copper layer.

3. The method according to claim 2 wherein the conductive protection layer comprises Ni/Au, Sn/Pb or chemical silver.

4. The method according to claim 3 wherein the conductive protection layer comprises Ni/Au.

5. The method according to claim 3 wherein the conductive protection layer comprises chemical silver.

6. The method according to claim 1 wherein the apertures occupy at least 50% the surface area of the pre-selected electrode areas.

* * * * *